United States Patent [19]

Russell et al.

[11] 3,943,554

[45] Mar. 9, 1976

[54] THRESHOLD SWITCHING INTEGRATED CIRCUIT AND METHOD FOR FORMING THE SAME

[75] Inventors: Lewis K. Russell, San Jose; Tich T. Dao, Cupertino; Richard S. Muller, Kensington, all of Calif.

[73] Assignee: Signetics Corporation, Sunnyvale, Calif.

[22] Filed: Feb. 10, 1975

[21] Appl. No.: 548,825

Related U.S. Application Data

[63] Continuation of Ser. No. 384,102, July 30, 1973, abandoned.

[52] U.S. Cl. .................. 357/34; 148/1.5; 357/12; 357/13; 357/15; 357/40; 357/65; 357/91
[51] Int. Cl.² ........................................ H01L 29/72
[58] Field of Search ............ 357/12, 13, 15, 34, 65, 357/91, 40

[56] References Cited
UNITED STATES PATENTS

| | | | |
|---|---|---|---|
| 3,079,512 | 2/1963 | Rutz | 357/12 |
| 3,434,023 | 3/1969 | Lesk | 357/12 |
| 3,463,975 | 8/1969 | Biard | 357/15 |
| 3,513,366 | 5/1970 | Clark | 357/15 |
| 3,751,680 | 8/1973 | Hodges | 357/15 |
| 3,810,127 | 5/1974 | Hoff | 357/12 |

*Primary Examiner*—Stanley D. Miller, Jr.
*Assistant Examiner*—Joseph E. Clawson, Jr.
*Attorney, Agent, or Firm*—Flehr, Hohback, Test, Albritton & Herbert

[57] ABSTRACT

A high speed threshold switching integrated circuit including a transistor and an integrally formed tunnel diode connected in parallel between the base and emitter of the transistor. The heavy doping necessary for the tunnel diode is achieved through the use of ion implantation. A current pulse applied to the emitter-base contact of the integrated circuit causes no collector current to flow until the point at which the rising current pulse exceeds the peak current of the tunnel diode. As the tunnel diode goes into the negative resistance region the transistor is turned on and rapidly pushed into near saturation with a consequent rapidly rising collector current.

1 Claim, 7 Drawing Figures

THRESHOLD SWITCHING INTEGRATED CIRCUIT AND METHOD FOR FORMING THE SAME

BACKGROUND OF THE INVENTION

This is a continuation of application Ser. No. 384,102, filed July 30, 1973, now abandoned.

Switching speed is very important in integrated circuits. For example, it is desirable to have a transistor which switches on as rapidly as possible to produce an output having a very short rise time. There is, therefore, a need for producing very fast switching currents for high speed circuits, as detailed in "Principles of Tunnel Diode Circuits," Woo F. Chow, John Wiley & Sons, 1964 Section 9.4.

OBJECTS AND SUMMARY OF THE INVENTION

Accordingly, it is an object of this invention to provide an integrated circuit and method for producing the same, which integrated circuit is capable of producing very fast rise time switching currents.

It is a more specific object of this invention to provide an integrated circuit and method for forming the same in which a tunnel diode is integrally formed with a transistor.

It is another object of this invention to provide an integrated circuit comprising a transistor and a parallel tunnel diode for producing a very fast rise time current at the collector of the transistor.

It is another object of this invention to provide an integrated circuit including a threshold switching transistor incorporating an integrally formed tunnel diode for improving the base noise margin of the transistor.

Briefly, in accordance with one embodiment of the invention, there is provided an integrated circuit and method for forming the same in which a transistor having base emitter and collector regions is formed in a semiconductor substrate. A tunnel diode is integrally formed in the transistor so as to be connected in parallel between the base and emitter of the transistor.

DESCRIPTION OF THE PREFERRED EMBODIMENTS

Referring now to the series of FIGS. 1 through 5, there are shown schematic cross-sections of an integrated circuit illustrating various of the processing steps of forming an integrated circuit in accordance with the method of this invention. In this series of FIGURES no attempt has been made to illustrate any of the conventional photolithographic masking techniques well known to those skilled in the art for forming the various regions in the semiconductor substrate.

Figure 1:
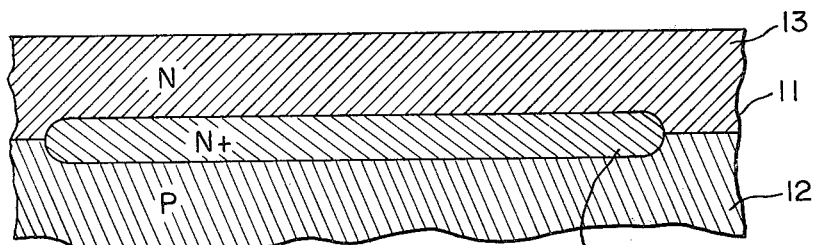
FIGS. 1 through 5 are schematic cross-sections of an integrated circuit illustrating various steps of the method of forming an integrated circuit in accordance with the invention in which a transistor and an integrally formed tunnel diode are formed in a semiconductor substrate.
Figure 2:
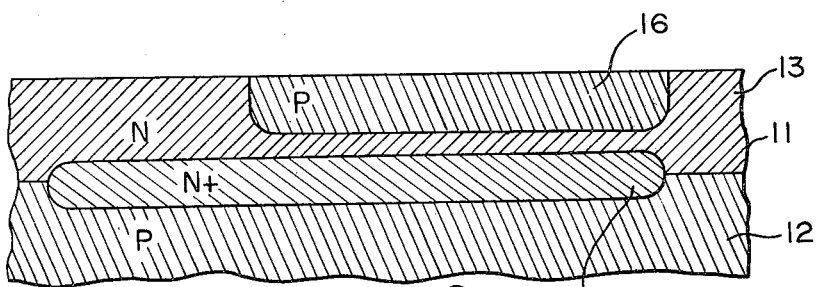

Thus, now referring to FIG. 1 specifically, there is shown a cross-sectional view of a semiconductor body 11 which may be formed of silicon. The semiconductor body 11 according to standard practice may comprise a substrate 12 which may be of P-type conductivity as illustrated with there being an epitaxial layer 13 grown on top of the substrate 12 and which may be of N-type conductivity. In accordance with standard practice, prior to growing the epitaxial layer 13 there may be provided a diffused N+ type impurity into the substrate 12 to result in a buried N+ layer 14. Next, as illustrated in FIG. 2, a P-type base region 16 is formed in the epitaxial N-type layer 13; the P-type base region 16 may be formed by conventional diffusion techniques for example.

Figure 3:
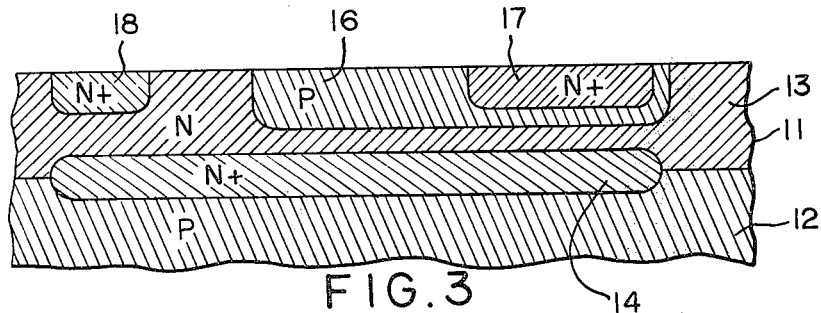

Subsequently, as indicated in FIG. 3 an N+ type emitter region 17 is formed in the base region 16 at the same time an N+ region 18 is formed in the N-type epitaxial layer 13 to serve as collector contact means.

Figure 4:
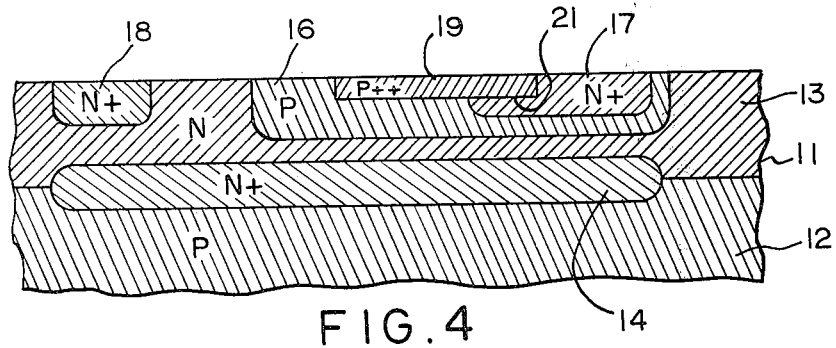

Turning now to a consideration of FIG. 4, there is illustrated the formation of a tunnel diode integral to the transistor structure. To form the tunnel diode a P++ region 19 is formed extending partially into the base region 16 and partially into the N+ emitter region 17. The tunnel diode junction 21 is thus formed between the P++ region 19 and the N+ emitter region 17. In order for this junction 21 to function as a tunnel diode the semiconductor regions on both sides of the junction need to be heavily doped. Emitter type regions are typically heavily doped having an impurity concentration on the order of $10^{19}$ to $10^{20}$ atoms per cubic cm. The ion implanted region 19 is also formed by high dose ion implantation at low energies. This region may be ion implanted with boron atoms for example, to yield a concentration on the order of $10^{20}$ atoms of boron per cubic cm.

Figure 5:
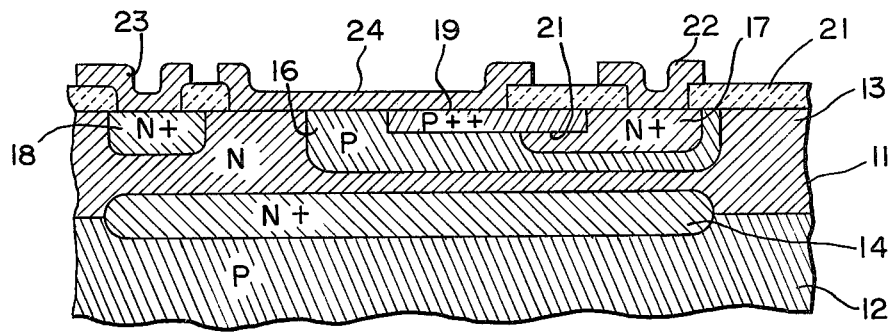

Turning now to FIG. 5 there is shown a cross-section of a completed device or circuit in accordance with this invention. In accordance with this particular embodiment of the invention a tunnel diode is integrally formed with a Schottky clamped transistor. In the structure shown in FIG. 5 there is thus provided an insulating layer 21 formed of silicon dioxide for example and disposed on the top surface of the semiconductor body. Windows or openings are formed in this silicon dioxide layer to allow contact to be made to the underlying semiconductor regions. Thus metallization 22 extends through a window in the silicon dioxide to contact the N+ region 17 and serve as the emitter contact to the transmitter. Metallization 23 extends through another opening in the silicon dioxide layer 21 and contacts the N+ collector contact region 18 to provide collector contact to the transistor. Broad area metallization 24 is disposed in another window or opening in the silicon dioxide layer 21 and serves as means for making contact to the base of the transistor. As mentioned before, the specific embodiment as shown in FIG. 5 utilizes a Schottky-clamped transistor so that the metallization 24 extends out over the collector region of the transistor.

Figure 6:
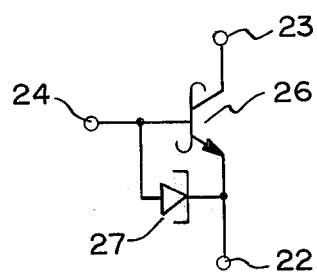
FIG. 6 is an equivalent circuit diagram of the structure shown in cross-section in FIG. 5.

The equivalent circuit for the structure of FIG. 5 is shown in FIG. 6. The equivalent circuit comprises a Schottky-clamped transistor 26 with a tunnel diode 27 extending between the base and emitter of the Schottky-clamped transistor 26. Thus the tunnel diode 27 is formed integrally in the transistor structure through ion implantation and there are only the three external emitter, base, and collector terminals indicated by reference numerals 22, 24 and 23, respectively.

Figure 7:
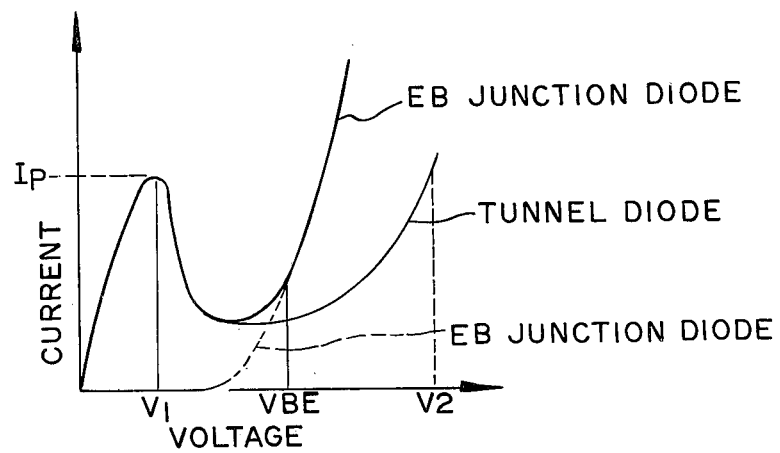
FIG. 7 is a plot of the V-I characteristics of the base emitter contacts of the circuit shown in FIG. 6.

Referring now to FIG. 7 there is shown a plot of the V-I characteristics of the base emitter contacts of the circuit of FIG. 6. The V-I characteristics of the base emitter contacts resemble the current summing of the separate diode characteristics of the base emitter junction of the transistor and the tunnel diode junction. In FIG. 7 the characteristic of the emitter base junction diode is shown by the dashed line and the narrow solid line corresponds to the separate characteristic of the tunnel diode. The relatively heavy solid line is a summing of the separate characteristics of the transistor and the tunnel diode. In operation, a current pulse is applied to the emitter base contacts of the circuit of FIG. 6. The tunnel diode has a very low impedance compared to the base emitter junction of the transistor so that initially all the applied current flows through the tunnel diode with there being substantially no current to the base emitter junction of the transistor. Therefore, initially no collector current flows. As the rising current pulse applied to the base emitter contact exceeds the peak current $I_p$ of the tunnel diode, the tunnel diode goes into its negative resistance region as shown in FIG. 7. The applied current immediately switches over to the base emitter junction of the transistor; that is, shifts to the emitter base junction diode characteristic curve shown in FIG. 7. Thus no collector current flows until the current in the base terminal gets above the peak current $I_p$ of the tunnel diode. Then immediately the current switches over to the second curve which is the regular emitter base junction characteristic curve for the transistor so that collector current begins to flow immediately at an already increased base current. The transistor is thus rapidly pushed into near saturation with a rapidly rising collector current. Utilizing the integrated circuit of this invention, collector current rise time of less than a nanosecond can be achieved.

In the plot in FIGS. 7 certain voltage values are indicated. Thus, the voltage $V_1$ is the voltage at which the peak current $I_p$ occurs through the tunnel diode; the voltage $V_{BE}$ is the turn on voltage for the base emitter of the transistor; and the voltage $V_2$ is the voltage at which the tunnel diode characteristic would be up from its valley to again reach a current level of $I_p$. It is necessary for operation of the integrated circuit in accordance with this invention that the characteristic of the tunnel diode and the characteristic of the base emitter junction of the transistor be such that the voltage $V_{BE}$ is bracketed between the voltage $V_1$ and $V_2$. The voltage $V_1$ at which the peak current $I_p$ occurs for a tunnel diode is typically less than 200 millivolts; the voltage $V_{BE}$ is typically greater than 200 millivolts so that there is no problem achieving $V_{BE}$ greater than $V_1$. In accordance with the construction as shown in FIG. 5 the same N+ type region 17 is used for the standard base emitter junction of the transistor and for the tunnel diode junction. The donor concentration is thus the same for both the emitter base junction of the transistor and the tunnel diode junction. The ion implanted P++ region 19 has an impurity concentration greater than the P-type base region 16 so that the acceptor concentration for the ion implanted tunnel region 19 is much greater than the acceptor concentration in the P-type base region 16. Thus the voltage of $V_2$ indicated in FIG. 7 will be greater than the value of $V_{BE}$. The current voltage characteristics of the base emitter junction for the transistor is thus bracketed between the voltages $V_1$ and $V_2$ for the two sections of the tunnel diode characteristic.

The embodiment of the invention shown in FIG. 5 is one wherein the tunnel diode is formed integrally with a Schottky clamped transistor. Schottky-clamped transistors are known in the art and are of advantage in high speed switching circuits in that Schottky transistors eliminate the base storage of minority carriers. The invention is not, however, limited to use with Schottky transistors and can be formed in accordance with the same technique in an ordinary planar transistor integrated circuit structure.

Further in accordance with the invention, the semiconductor body 11 is formed of silicon. Typical prior art tunnel diodes have been formed in germanium and it has been difficult to achieve the high doping concentration that is necessary to form tunnel diodes in silicon. Through the use of ion implantation to form the P++ region 19 the necessary high doping concentrations (on the order of $10^{20}$ ions per cu.cm.) can be easily achieved.

Although the invention has been described with reference to particular embodiments, it should be obvious to those skilled in the art that various modifications are possible to the specific embodiments disclosed herein without departing from the true spirit and scope of the invention.

We claim:

1. An integrated circuit comprising a silicon semiconductor body of first conductivity type and having a generally planar top surface, a base region of a second conductivity type formed in said semiconductor body and being defined by a first dishshaped PN junction extending to the surface, an emitter region of said first conductivity type formed in said base region and being defined by a second PN junction extending to the surface, a tunnel diode region of said second conductivity type formed in said base region extending to and terminating at said surface and extending laterally with respect to said surface to overlap a portion of said second PN junction, said tunnel diode region having a high doping concentration relative to said base region together with metallization carried by said surface forming solely in combination with said surface a combination metallization contact partially overlying and making contact at said surface to said collector, said base and said tunnel diode regions and an additional contact to said emitter region to form a Schottky-clamped threshold switched integrated circuit.

* * * * *